United States Patent
Sano et al.

(10) Patent No.: US 9,688,528 B2
(45) Date of Patent: Jun. 27, 2017

(54) SUBSTRATE FOR DIAPHRAGM-TYPE RESONANT MEMS DEVICES, DIAPHRAGM-TYPE RESONANT MEMS DEVICE AND METHOD FOR MANUFACTURING SAME

(71) Applicant: FUJIFILM Corporation, Tokyo (JP)

(72) Inventors: Takahiro Sano, Kanagawa (JP); Takayuki Naono, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/970,933

(22) Filed: Dec. 16, 2015

(65) Prior Publication Data

US 2016/0107880 A1 Apr. 21, 2016

Related U.S. Application Data

(63) Continuation of application No. PCT/JP2014/067678, filed on Jul. 2, 2014.

(30) Foreign Application Priority Data

Jul. 12, 2013 (JP) ................... 2013-146346

(51) Int. Cl.
*H04R 17/00* (2006.01)
*B81B 3/00* (2006.01)
(Continued)

(52) U.S. Cl.
CPC ........ *B81B 3/0072* (2013.01); *B81C 1/00666* (2013.01); *G01C 19/56* (2013.01);
(Continued)

(58) Field of Classification Search
CPC .. H04R 2201/003; H04R 17/00; H04R 17/02; H04R 17/10; H01L 41/083; H01L 41/1132; H01L 41/27; H01L 41/319
See application file for complete search history.

(56) References Cited

U.S. PATENT DOCUMENTS 6,888,947 B2 * 5/2005 Takeshima ............. H04R 17/00
310/348
8,891,333 B2 * 11/2014 Onishi .................. H02N 2/001
367/99
(Continued)

FOREIGN PATENT DOCUMENTS

| JP | H11-082777 A | 3/1999 |
| JP | 2007-129776 A | 5/2007 |
| JP | 2010-147658 A | 7/2010 |

OTHER PUBLICATIONS

International Search Report—PCT/JP2014/067678 dated Oct. 7, 2014.

*Primary Examiner* — John C Ingham
(74) *Attorney, Agent, or Firm* — Studebaker & Brackett PC

(57) ABSTRACT

A producing method for a diaphragm-type resonant MEMS device includes forming a first silicon oxide film, forming a second silicon oxide film, forming a lower electrode, forming a piezoelectric film, forming an upper electrode, laminating the first silicon oxide film, the second silicon oxide film, the lower electrode, the piezoelectric film, and the upper electrode in this order on a first surface of a silicon substrate, and etching the opposite side surface of the first surface of the silicon substrate by deep reactive ion etching to form a diaphragm structure, in which the proportion $R_2$ of the film thickness $t_2$ of the second silicon oxide film with respect to the sum of the film thickness $t_1$ of the first silicon oxide film and the film thickness $t_2$ of the second silicon oxide film satisfies the following condition:

$0.10\ \mu m \leq t_1 \leq 2.00\ \mu m$; and $R_2 \geq 0.70$.

19 Claims, 7 Drawing Sheets

(51) Int. Cl.
| | |
|---|---|
| *G01C 19/56* | (2012.01) |
| *G01P 15/09* | (2006.01) |
| *H03H 9/17* | (2006.01) |
| *H04R 17/10* | (2006.01) |
| *H01L 41/08* | (2006.01) |
| *H01L 41/113* | (2006.01) |
| *H01L 41/319* | (2013.01) |
| *H04R 31/00* | (2006.01) |
| *B81C 1/00* | (2006.01) |
| *H03H 3/02* | (2006.01) |
| *H03H 3/04* | (2006.01) |
| *G01P 15/08* | (2006.01) |

(52) U.S. Cl.
CPC .......... *G01P 15/09* (2013.01); *H01L 41/0815* (2013.01); *H01L 41/1138* (2013.01); *H01L 41/319* (2013.01); *H03H 9/17* (2013.01); *H04R 17/10* (2013.01); *H04R 31/00* (2013.01); *B81B 2203/0127* (2013.01); *B81B 2203/0353* (2013.01); *B81B 2203/04* (2013.01); *B81C 2201/0112* (2013.01); *B81C 2201/0169* (2013.01); *B81C 2201/0176* (2013.01); *G01P 2015/084* (2013.01); *H03H 2003/027* (2013.01); *H03H 2003/0414* (2013.01); *H04R 2201/003* (2013.01)

(56) References Cited

U.S. PATENT DOCUMENTS

| | | | |
|---|---|---|---|
| 8,896,184 B2* | 11/2014 | Grosh | H04R 17/00 310/332 |
| 8,981,618 B2* | 3/2015 | Sinha | H03H 9/15 310/320 |
| 8,981,624 B2* | 3/2015 | Martin | B81B 3/0072 310/324 |
| 9,024,709 B2* | 5/2015 | Joshi | H01P 1/219 333/210 |

* cited by examiner

SUBSTRATE FOR DIAPHRAGM-TYPE RESONANT MEMS DEVICES, DIAPHRAGM-TYPE RESONANT MEMS DEVICE AND METHOD FOR MANUFACTURING SAME

CROSS-REFERENCE TO RELATED APPLICATIONS

This application is a Continuation of PCT International Application No. PCT/JP2014/067678 filed on Jul. 2, 2014, which claims priority under 35 U.S.C §119(a) to Japanese Patent Application No. 2013-146346 filed on Jul. 12, 2013. Each of the above applications is hereby expressly incorporated by reference, in its entirety, into the present application.

BACKGROUND OF THE INVENTION

1. Field of the Invention

The present invention relates to a substrate for diaphragm-type resonant MEMS (Micro Electro Mechanical System) devices, a diaphragm-type resonant MEMS device, and a method for producing the same, and more particularly, to a technology for forming a thin film on a silicon substrate and thereby forming a diaphragm structure.

2. Description of the Related Art

There are known technologies for forming a MEMS device having a diaphragm structure using a SOI (Silicon on Insulator) substrate. In this case, a handle layer and an insulating layer are selectively removed from the back surface of the SOI substrate, and the device layer of the removed regions serves as a diaphragm.

In regard to the method for producing a diaphragm structure using a highly expensive bonding substrate as such, approaches have been taken to produce an equivalent diaphragm structure from a thin film formed on an inexpensive silicon substrate.

For example, JP 2007-129776 A and JP 2010-147658 A disclose methods for suppressing resonant frequency modulation by depositing $SiO_2$, SiN or the like as a diaphragm material on a silicon substrate, and increasing the film thickness accuracy of a diaphragm structure. Also, JP 1999-82777 A (JP-H11-82777A) discloses a gas sensor in which the initial strain of a diaphragm structure has been reduced by laminating $SiO_2$ and SiN.

SUMMARY OF THE INVENTION

However, JP 2007-129776 A, JP 2010-147658 A, and JP 1999-82777 A (JP-H11-82777A) do not mention anything about the shift in resonant frequency resulting from a change in residual stress in a diaphragm structure (hereinafter, also referred to as "shift in resonant frequency caused by residual stress" or the shift in resonant frequency attributable to DRIE (Deep Reactive Ion Etching) (hereinafter, also referred to as "shift in resonant frequency caused by ion implantation"), and no attention is paid to the problem.

The present invention was achieved in view of such circumstances, and thus, an object of the invention is to provide a substrate for diaphragm-type resonant MEMS devices, which suppresses a shift in resonant frequency caused by the residual stress of a diaphragm material, while also suppressing a shift in resonant frequency caused by ion implantation, and increases the stability of the resonant frequency; a diaphragm-type resonant MEMS device; and a method for producing the same.

In order to achieve the object described above, according to an aspect of the invention, a method for producing a diaphragm-type resonant MEMS device includes a first oxide film forming step of forming a first silicon oxide film by thermal oxidation, or by a process including a heat treatment at 900° C. or above; a second oxide film forming step of forming a second silicon oxide film having a stress with an absolute value of 100 [MPa] or less; a lower electrode forming step of forming a lower electrode; a piezoelectric film forming step of forming a piezoelectric film; an upper electrode forming step of forming an upper electrode; a lamination step of laminating, on a first surface of a silicon substrate, the first silicon oxide film, the second silicon oxide film, the lower electrode, the piezoelectric film, and the upper electrode in this order; and an etching step of subjecting the surface on the reverse side of the first surface of the silicon substrate to etching processing by deep reactive ion etching until the first silicon oxide film is exposed so as to form a recess, and thereby forming a diaphragm structure having the first silicon oxide film and the second silicon oxide film as a diaphragm, in which method when the film thickness of the first silicon oxide film is designated as $t_1$, the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$ (hereinafter, also simply referred to as the "proportion of the film thickness of the second silicon oxide film"), is designated an $R_2$, the condition: $0.10\ [\mu m] \le t_1 \le 2.00\ [\mu m]$ and the condition $R_2 \ge 0.70$ are satisfied.

According to this aspect, since the first silicon oxide film and the second silicon oxide film have been formed such that when the film thickness of the first silicon oxide film formed by thermal oxidation or by a process including a heat treatment at 900° C. or above is designated as $t_1$, the film thickness of the second silicon oxide film having a stress with an absolute value of 100 [MPa] or less is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: $0.10\ [\mu m] \le t_1 \le 2.00\ [\mu m]$, and the condition: $R_2 \ge 0.70$ are satisfied, the stability of resonant frequency can be increased by suppressing the shift in resonant frequency caused by the residual stress of the diaphragm materials, and also by suppressing the shift in resonant frequency caused by ion implantation.

In order to achieve the object described above, according to another aspect of the invention, a method for producing a diaphragm-type resonant MEMS device includes forming an upper electrode on the piezoelectric side of a substrate for diaphragm-type resonant MEMS devices, in which a first silicon oxide film formed by thermal oxidation or by a process including a heat treatment at 900° C. or above, a second silicon oxide film having a stress with an absolute value of 100 [MPa] or less, a lower electrode, and a piezoelectric film are laminated in this order on a first surface of a silicon substrate; and etching the opposite side surface of the first surface of the silicon substrate by deep reactive ion etching until the first silicon oxide film is exposed so as to form a recess, and thereby forming a diaphragm structure including a diaphragm having the first silicon oxide film and the second silicon oxide film, in which method when the film thickness of the first silicon oxide film is designated as $t_1$, the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: 0.10 [μm]≤$t_1$≤2.00 [μm] and the condition: $R_2$≥0.70 are satisfied.

According to this aspect, a diaphragm structure having the first silicon oxide film and the second silicon oxide film as a diaphragm has been formed by forming an upper electrode is formed on the piezoelectric film side of a substrate for diaphragm-type resonant MEMS devices, which satisfies the condition: 0.10 [μm]≤$t_1$≤2.00 [μm] and the condition: $R_2$≥0.70, when the film thickness of the first silicon oxide film formed by thermal oxidation or by a process including a heat treatment at 900° C. or above is designated as $t_1$, the film thickness of the second silicon oxide film having a stress with an absolute value of 100 [MPa] or less is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$; and subjecting the surface on the opposite side surface of the first surface of the silicon substrate to etching processing by deep reactive ion etching until the first silicon oxide film is exposed so as to form a recess. Therefore, the stability of resonant frequency can be increased by suppressing the shift in resonant frequency caused by the residual stress of the diaphragm materials, and also suppressing the shift in resonant frequency caused by ion implantation.

It is preferable that the film thickness $t_1$ of the first silicon oxide film satisfies the condition: $t_1$≤1.00 [μm]. Thereby, the stability of resonant frequency can be increased, and also, the time taken by the process for forming the first silicon oxide film can be shortened.

It is preferable that the film thickness $t_1$ of the first silicon oxide film satisfies the condition: $t_1$≥0.20 [μm]. Thereby, the shift in resonant frequency caused by the ion implantation of the deep reactive ion etching can be further suppressed.

It is preferable that the proportion $R_2$ of the film thickness of the second silicon oxide film with respect to the sum of the film thickness of the first silicon oxide film and the film thickness of the second silicon oxide film satisfies the condition: $R_2$≥0.80. Thereby, the shift in resonant frequency caused by the stress of the first silicon oxide film can be further suppressed.

It is preferable that the proportion $R_2$ of the film thickness of the second silicon oxide film with respect to the sum of the film thickness of the first silicon oxide film and the film thickness of the second silicon oxide film satisfies the condition: $R_2$≥0.90. Thereby, the shift in resonant frequency caused by the stress of the first silicon oxide film can be further suppressed.

It is preferable that the proportion $R_2$ of the film thickness of the second silicon oxide film with respect to the sum of the film thickness of the first silicon oxide film and the film thickness of the second silicon oxide film satisfies the condition: $R_2$≤0.97. Thereby, the shift in resonant frequency caused by the ion implantation of the deep reactive ion etching can be suppressed.

It is preferable that the film thickness $t_2$ of the second silicon oxide film satisfies the condition: $t_2$≤10.00 [μm]. Thereby, uniformity of the film thickness of the second silicon oxide film can be maintained.

In the second oxide film forming step, the second silicon oxide film is formed by a TEOS-CVD method. Thereby, a second silicon oxide film having a stress with an absolute value of 100 [MPa] or less can be appropriately laminated.

It is preferable to perform 25% to 40% of over-etching, in the etching step. Thereby, a recess can be appropriately formed.

It is preferable that the deep reactive ion etching is achieved by a Bosch process. Thereby, the back surface of the silicon substrate can be appropriately processed by etching.

Before the upper electrode forming step, a through-hole forming step of forming through-holes that penetrate through the piezoelectric film may also be included. Thereby, conduction to the lower electrode can be appropriately achieved.

In order to achieve the object described above, according to another aspect of the invention, a diaphragm-type resonant MEMS device includes a laminate in which a first silicon oxide film, a second silicon oxide film, a lower electrode, a piezoelectric film, and an upper electrode are laminated in this order; and a silicon substrate that supports the laminate in a diaphragm-like manner through the first silicon oxide film side of the laminate, in which device the second silicon oxide film has a stress with an absolute value of 100 [MPa] or less, and when the film thickness of the first silicon oxide film is designated as the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: 0.10 [μm]≤$t_1$≤2.00 [μm] and the condition: $R_2$≥0.70 are satisfied.

According to this aspect, since the diaphragm-type resonant MEMS device is formed such that when the film thickness of the first silicon oxide film is designated as $t_1$, the film thickness of the second silicon oxide film having a stress with an absolute value of 100 [MPa] or less is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: 0.10 [μm]≤$t_1$≤2.00 [μm] and the condition: $R_2$≥0.70 are satisfied, the shift in resonant frequency caused by the residual stress of the diaphragm materials is suppressed, while the shift in resonant frequency caused by ion implantation is suppressed, and thus the stability of resonant frequency can be increased.

In order to achieve the object described above, there is provided a substrate for diaphragm-type resonant MEMS devices, in which a first silicon oxide film formed by thermal oxidation or by a process including a heat treatment at 900° C. or above, a second silicon oxide film having a stress with an absolute value of 100 [MPa] or less, a lower electrode, and a piezoelectric film are laminated in this order on the surface of a silicon substrate, and when the film thickness of the first silicon oxide film is designated as the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: 0.10 [μm]≤$t_1$≤2.00 [μm] and the condition: $R_2$≥0.70 are satisfied.

According to this aspect, since the substrate is formed such that when the film thickness of the first silicon oxide film is designated as $t_1$, the film thickness of the second silicon oxide film having a stress with an absolute value of 100 [MPa] or less is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the condition: 0.10 [μm]≤$t_1$≤2.00 [μm] and the condition: $R_2$0.70 are satisfied, the shift in resonant frequency caused by the residual stress of the diaphragm materials is suppressed, while the shift in resonant frequency caused by ion implantation is also suppressed, and thus the stability of resonant frequency can be increased.

According to the invention, as a diaphragm structure is formed by forming a laminate structure on a silicon substrate, the shift in resonant frequency caused by residual stress or the shift in resonant frequency caused by ion implantation can be suppressed, while a substantial cost reduction is realized, and thus high stability of the resonant frequency can be obtained.

DESCRIPTION OF THE PREFERRED EMBODIMENTS

Hereinafter, a preferred exemplary embodiment of the invention will be described in detail with reference to the attached drawings.

[Method for Producing Diaphragm-Type Resonant MEMS Device]

Figure 1:
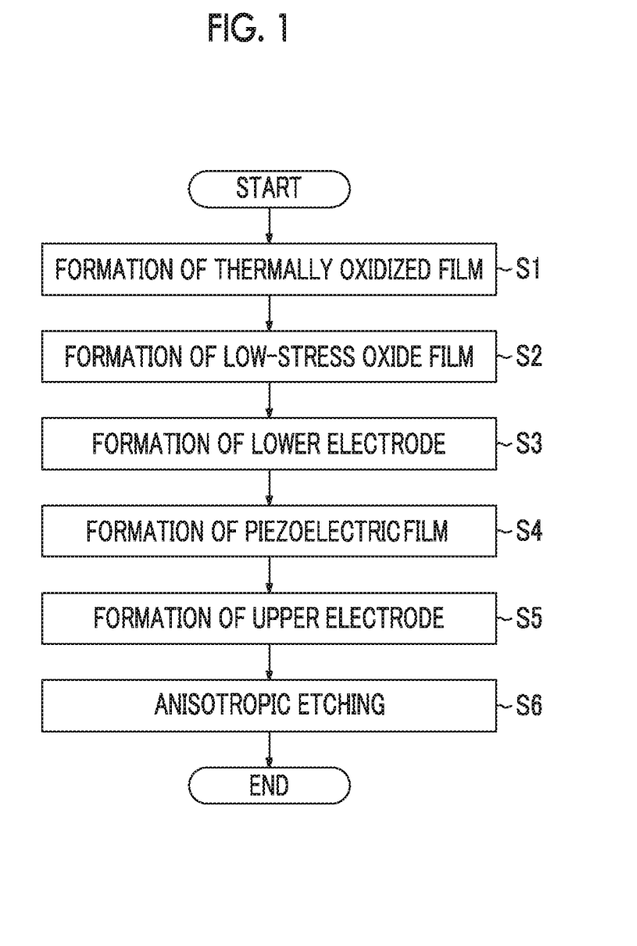
FIG. 1 is a flow chart illustrating a method for producing a diaphragm-type resonant MEMS device.
Figure 2:
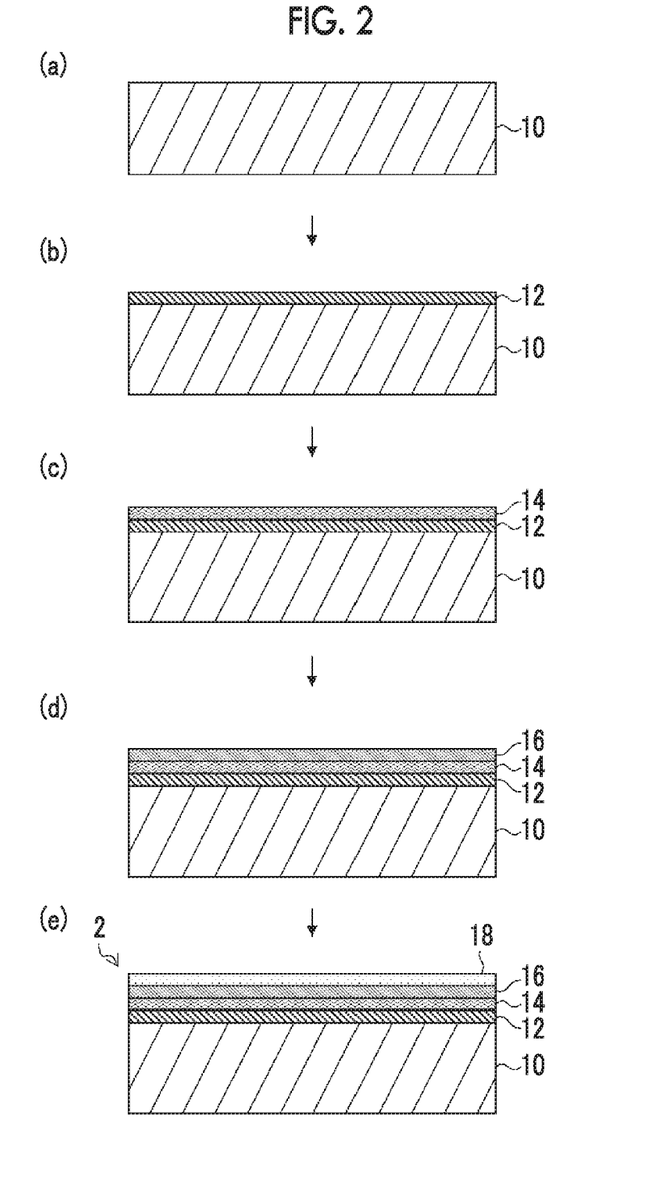
FIG. 2 is a cross-sectional diagram of a substrate obtainable in the respective steps illustrated in FIG. 1.
Figure 3:
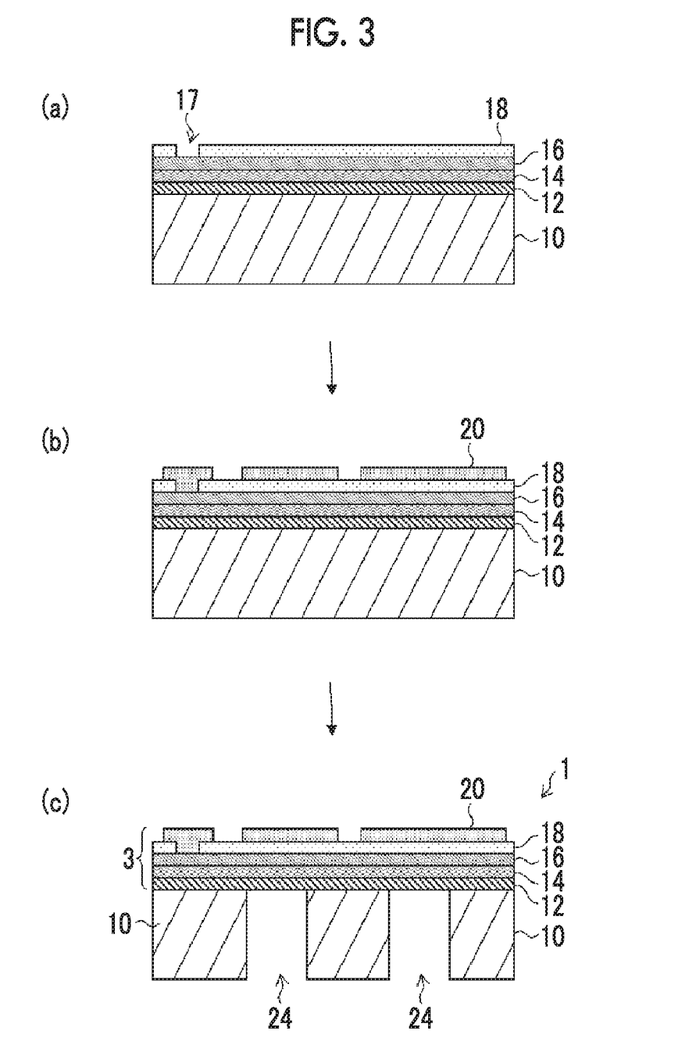
FIG. 3 is a cross-sectional diagram of the substrate obtainable in the respective steps illustrated in FIG. 1.

FIG. 1 is a flow chart illustrating the method for producing a diaphragm-type resonant MEMS device according to the present exemplary embodiment. Furthermore, FIG. 2 and FIG. 3 are each a cross-sectional diagram of a substrate obtainable in the respective steps illustrated in FIG. 1. In the present exemplary embodiment, as illustrated in (a) of FIG. 2, the substrate is produced using a bulk silicon substrate (silicon substrate) 10.

(Step S1: Example of First Oxide Film Forming Step)

A silicon substrate 10 is subjected to a thermal oxidation treatment, and a thermally oxidized SiO$_2$ (silicon dioxide) film 12 (an example of the first silicon oxide film) is formed on the front surface (an example of the first surface) of the silicon substrate 10 (shown in (b) of FIG. 2). It is required that the first silicon oxide film be formed on at least one surface of the silicon substrate 10, and the first silicon oxide film may be formed over the entire surface of the silicon substrate 10. According to the present exemplary embodiment, the thermally oxidized SiO$_2$ film 12 is formed such that the film thickness $t_1$ [μm] satisfies the condition:

$$0.00 \ [\mu m] \leq t_1 \leq 2.00 \ [\mu m] \tag{Expression 1}$$

Meanwhile, when it is said that $t_1$0.00 [μm], it is implied that the thermal oxidation treatment of Step S1 has not been conducted.

The thermally oxidized SiO$_2$ film 12 formed by a thermal oxidation treatment exhibits a peak near 1090 [cm$^{-1}$], which represents the stretch mode of the Si—O bond (bond between silicon and oxygen), in the FTIR (Fourier Transform Infrared: Fourier transform infrared spectrophotometry) absorption spectrum, and has a Si—O—Si bond angle (bond angle between silicon and oxygen) of 148°. Furthermore, neither C (carbon) nor H (hydrogen) is not detected in an analysis of the composition in the membrane based on XPS (X-ray Photoelectron Spectroscopy) or SIMS (Secondary Ion-microprobe Mass Spectrometer). Furthermore, the absolute value of the stress of the thermally oxidized SiO$_2$ film 12 is about 300 [MPa].

Additionally, it is known that a SiO$_2$ film obtained by performing deposition by a CVD (Chemical Vapor Deposition) method or the like and then performing a heat treatment at a high temperature (900° C. or higher), also exhibits a peak near 1090 [cm$^{-1}$] in the FTIR absorption spectrum, and has a film quality equivalent to that of a thermally oxidized film (for example, J. Electrochem. Soc., 142 (1995), 3579). As such, even an oxidized film formed by a method other than a thermal oxidation treatment can be used as a substitute of the thermally oxidized SiO$_2$ film 12 when the oxidized film is subjected to a heat treatment at 900° C. or above.

Furthermore, while the etching rate for Si (silicon) in the Bosch process (an example of deep reactive ion etching) that will be described below is 4,000 [μm/min], the etching rate for thermally oxidized SiO$_2$ is 0.020 [μm/min].

(Step S2: Example of Second Oxide Film Forming Step)

Next, a TEOS-SiO$_2$ film 14 (an example of the second silicon oxide film; hereinafter, referred to as "low-stress silicon oxide film 14") is formed as a low-stress silicon oxide film on the thermally oxidized SiO$_2$ film 12 formed in Step S1, by a TEOS (TetraEthyl OrthoSilicate)-CVD method (shown in (c) of FIG. 2). In the present exemplary embodiment, when the film thickness of the thermally oxidized SiO$_2$ film 12 is designated as $t_1$ [μm], the film thickness of the TEOS-SiO$_2$ film 14 is designated as $t_2$ [μm], and the stress of the second silicon oxide film is designated as $\sigma_2$ [MPa], the film was formed so as to satisfy the conditions:

$$0 \leq t_2/(t_1+t_2) \leq 1 \tag{Expression 2}$$

$$|\sigma_2| \leq 100 \ [\text{MPa}] \tag{Expression 3}$$

Meanwhile, in addition to TEOS-CVD, the low-stress silicon oxide film 14 can also be formed using a SiO$_2$ film formed by a CVD method such as a LP (Low Pressure)-CVD method or an AP (Atmospheric Pressure)-CVD method, or a sputtering method.

In the TEOS-SiO$_2$ film 14 formed as such, Si—O bonds are sparsely arranged as compared to the case of the thermally oxidized SiO$_2$ film 12. The Si—O—Si bond angle that can be determined by FTIR is increased up to 150° or larger, and the peak of the stretch mode of the Si—O bond is also shifted. Furthermore, the TEOS-SiO$_2$ film 14 is characterized in that C and H are included in the film, and Si—O—H bonds or O—H bonds are detected.

The etching rate in the Bosch process for the TEOS-SiO$_2$ film 14 is 0.023 [µm/min], and the etch stop performance is almost equivalent to that of the thermally oxidized SiO$_2$ film 12.

(Step S3: Example of Lower Electrode Forming Step)

Next, a lower electrode 16 is formed on the TEOS-SiO$_2$ film 14 formed in Step 2 (shown in (d) of FIG. 2). The lower electrode 16 is an electrode for applying an electric field to the piezoelectric film 18 that will be described below, and is required to have adhesiveness to the material of the base layer (in the present exemplary embodiment, the TEOS-SiO$_2$ film 14) and the material of the piezoelectric film 18 formed on the lower electrode in the subsequent step.

Well known as the materials that are highly adhesive to films of Si or SiO$_2$ and PZT (lead zirconate titanate) are Pt (platinum) and Ir (iridium). According to the present exemplary embodiment, Ir is used as the lower electrode material, and a lower electrode 16 is obtained by depositing Ir to a thickness of 0.20 [µm] on the low-stress silicon oxide film 14 by a sputtering method, which gives excellent in-plane uniformity.

(Step S4: Example of Piezoelectric Film Forming Step)

Next, a piezoelectric film 18 is formed on the lower electrode 16 formed in Step S3 (shown in (e) of FIG. 2).

In the present exemplary embodiment, PZT deposited by a sputtering method is used as the piezoelectric film 18. Preferably, Nb-doped PZT, Which has an increased piezoelectric constant as a result of doping with Nb (niobium), is deposited by a sputtering method. In addition to that, lead titanate, lead zirconate, zirconium niobate-lead titanate, and the like can be used as the piezoelectric film 18.

Meanwhile, when the piezoelectric film 18 is formed using a sol-gel method (sol-gel process) of performing calcination at a high temperature or the like, this leads to alteration of the thermally oxidized SiO$_2$ film 12, the TEOS-SiO$_2$ film 14 or deterioration of the lower electrode 16, and to the exertion of thermal stress. Therefore, it is preferable that the piezoelectric film 18 is formed by gas-phase film formation such as a sputtering method.

As such, an intermediate product in which the thermally oxidized SiO$_2$ film 12, the TEOS-SiO$_2$ film 14, the lower electrode 16, and the piezoelectric film 18 are laminated in this order on the silicon substrate 10, is referred to as a substrate for diaphragm-type resonant MEMS devices 2.

Figure 4:
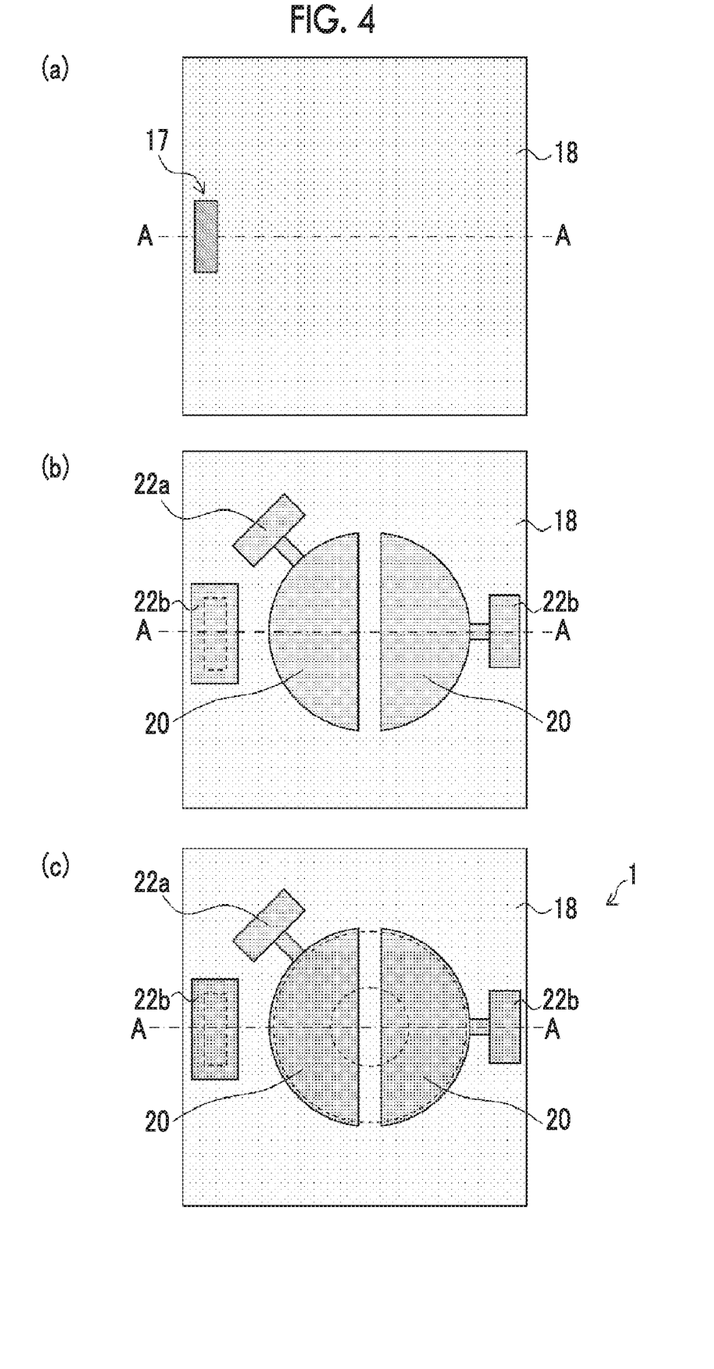
FIG. 4 is a plan view diagram of a silicon substrate viewed from the laminate side.

Furthermore, a contact hole 17 is formed on the piezoelectric film 18 in the area where connection to the lower electrode 16 is made (shown in (a) of FIG. 3). A plan view diagram of the silicon substrate 10 viewed from the side of the piezoelectric film 18 is shown in (a) of FIG. 4. Meanwhile, a cross-sectional diagram obtained by cutting the silicon substrate along the A-A line shown in (a) of FIG. 4 is shown in (a) of FIG. 3.

(Step S5: Example of Upper Electrode Forming Step)

Next, an upper electrode 20 is formed on the piezoelectric film 18 formed in Step S4 (shown in (b) of FIG. 3). A plan view diagram of the silicon substrate 10 viewed from the side of the upper electrode 20 is shown in (b) of FIG. 4, and a cross-sectional diagram obtained by cutting the silicon substrate along the A-A line shown in (b) of FIG. 4 is shown in (b) of FIG. 3.

The upper electrode 20 is an electrode for applying an electric field to the piezoelectric film 18, and is formed on top of the piezoelectric film 18. Regarding the upper electrode 20, an electrically conductive material having high adhesiveness to the piezoelectric film 18 is selected, and also, a pattern forming method which gives satisfactory in-plane uniformity, such as a sputtering method or a vapor deposition method, is selected. According to the present exemplary embodiment, a two-layered structure composed of Ti (titanium) having a thickness of 0.02 [µm] and Au (gold) having a thickness of 0.30 [µm], the two layers being respectively formed by a sputtering method, is used as the upper electrode 20.

Meanwhile, a pad 22a that is utilized for the conductive connection to the lower electrode 16 via the contact hole 17, and a pad 22b that is utilized for the conductive connection to the upper electrode 20 are also formed simultaneously with the upper electrode 20.

As such, Step S1 to Step S5 constitute a lamination step of laminating, on the surface of a silicon substrate 10, a thermally oxidized SiO$_2$ film 12, a TEOS-SiO$_2$ film 14, a lower electrode 16, a piezoelectric film 18, and an upper electrode 20 in this order (in the order of the thermally oxidized SiO$_2$ film 12, the TEOS-SiO$_2$ film 14, the lower electrode 16, the piezoelectric film 18, and the upper electrode 20).

Meanwhile, it is required that the thermally oxidized SiO$_2$ film 12, the TEOS-SiO$_2$ film 14, the lower electrode 16, the piezoelectric film 18, and the upper electrode 20 be laminated in this order, and it is also possible to laminate other new layers between these layers.

(Step S6: Example of Etching Step)

Next, the back surface of the silicon substrate 10 (an example of the surface on the reverse side of the first surface) is subjected to anisotropic etching, and openings 24 (an example of the recess) at which the thermally oxidized SiO$_2$ film 12 is exposed are formed. Thus, a diaphragm structure employing the thermally oxidized SiO$_2$ film 12 and the TEOS-SiO$_2$ film 14 as a diaphragm and the silicon substrate 10 as a support member (diaphragm-type resonant MEMS device 1) is formed (shown in (c) of FIG. 3). A plan view diagram of the silicon substrate 10 viewed from the upper electrode 20 is shown in (c) of FIG. 4, and the openings 24 are indicated by broken lines therein. Meanwhile, a cross-sectional diagram obtained by cutting the silicon substrate along the A-A line shown in (c) of FIG. 4 is shown in (c) of FIG. 3.

In the present exemplary embodiment, anisotropic etching was carried out, while side walls were protected, using a Bosch process apparatus (Deep RIE apparatus MUC-21 manufactured by Sumitomo Precision Products Co., Ltd.) as the etching apparatus, by a Bosch process system by which etching with SF$_6$ gas and deposition with C$_4$F$_8$ gas were repeated. Also, 25% to 40% of over-etching was achieved at the parts where etching proceeded most rapidly.

As illustrated in (c) of FIG. 3 and (c) of FIG. 4, the diaphragm-type resonant MEMS device 1 related to the present exemplary embodiment is composed of a laminate 3 in which a thermally oxidized SiO$_2$ film 12, a TEOS-SiO$_2$ film 14, a lower electrode 16, a piezoelectric film 18, and an upper electrode 20 are laminated in this order; and a silicon substrate 10 that supports the laminate 3 in a diaphragm-like manner through the side of the thermally oxidized SiO$_2$ film 12.

Meanwhile, regarding the method for producing the diaphragm-type resonant MEMS device 1 (substrate for diaphragm-type resonant MEMS devices 2), an embodiment in which some of the processes among the entire process shown in the flow chart illustrated in FIG. 1 are omitted can also be considered.

For example, an embodiment in which a silicon substrate 10 having a thermally oxidized SiO$_2$ film 12 formed on the surface (shown in (b) of FIG. 2) is prepared in advance, and production is initiated from the process of forming a TEOS- SiO$_2$ film 14 of Step S2, is also included in the production method of the present exemplary embodiment. Furthermore, an embodiment in which a silicon substrate 10 having a thermally oxidized SiO$_2$ film 12 and a TEOS-SiO$_2$ film 14 formed on the surface (shown in (c) of FIG. 2) is prepared in advance, and production is initiated from the process of forming a lower electrode 16 of Step S3, is also included in the production method of the present exemplary embodiment. Even in these cases, it is desirable that the film thickness $t_1$ [μm] of the thermally oxidized SiO$_2$ film 12, the film thickness $t_2$ [μm] of the TEOS-SiO$_2$ film 14, and the stress $\sigma_2$ [MPa] of the TEOS-SiO$_2$ film 14 satisfy the (Expression 1) to (Expression 3) given above.

Furthermore, an embodiment in Which a silicon substrate 10 having a thermally oxidized SiO$_2$ film 12, a TEOS-SiO$_2$ film 14, and a lower electrode 16 formed on the surface (shown in (d) of FIG. 2) is prepared in advance, and production is initiated from the process of forming a piezoelectric film 18 of Step S4, is also included in the use of the production method of the present exemplary embodiment.

Also, an embodiment in which a substrate for diaphragm-type resonant MEMS devices 2 (shown in (e) of FIG. 2) is prepared, and production of a diaphragm-type resonant MEMS device 1 is initiated from the process of forming an upper electrode 20 of Step S5, is also included in the present exemplary embodiment. As illustrated in (a) of FIG. 3, an embodiment in which a substrate for diaphragm-type resonant MEMS devices 2 is prepared, and a contact hole 17 is formed thereon before an upper electrode 20 is formed, can also be considered.

[Evaluation of Properties of Diaphragms by Evaluation of Resonant Frequency]

Figure 5:
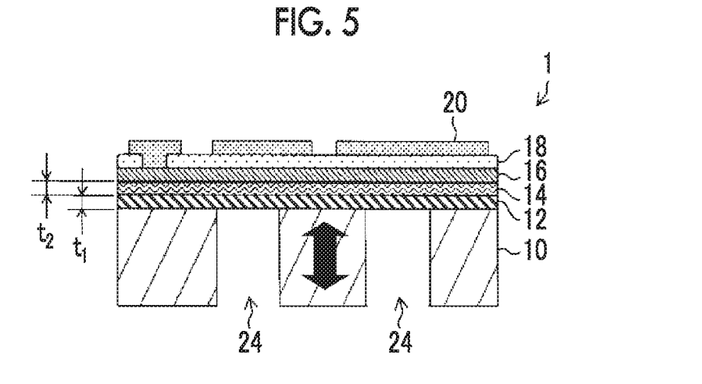
FIG. 5 is a diagram illustrating the primary resonance mode of a diaphragm-type resonant MEMS device.

The resonant frequency of the primary resonant mode (mode in which movement is made in the direction of a line normal to the substrate (direction of the arrow in FIG. 5)) of the diaphragm-type resonant MEMS device produced by the production method using a gyro-sensor as a base, was measured using a laser Doppler vibration meter. In order for a diaphragm to be practically useful, the amount of shift in the resonant frequency relative to the design value needs to be less than 10%. The amount of shift in the resonant frequency relative to the design value is preferably 5% or less, and when the amount of shift is 2% or less, excellent stability is obtained.

(Implementation Results 1)

A thermally oxidized SiO$_2$ film 12 and a TEOS-SiO$_2$ film 14 were formed such that when the film thickness of the thermally oxidized SiO$_2$ film 12 is designated as $t_1$ and the film thickness of the TEOS-SiO$_2$ film 14 is designated as $t_2$, the following conditions are satisfied:

$$t_1 + t_2 = 3.00 \text{ [μm]} \quad \text{(Expression 4)}$$

$$6 \leq R_2 = t_2/(t_1+t_2) \leq 1 \quad \text{(Expression 5)}$$

Furthermore, the design value of the primary resonant mode of the diaphragm-type resonant MEMS device is designated as $f_{design}$, while the measured value is designated as $f_{measured}$, and the amount of shift in the measured value relative to the design value, $|\Delta f_r|$, is defined by the following (Expression 6).

$$|\Delta f_r| = |(f_{measured} - f_{design})/f_{design}| \times 100 \quad \text{(Expression 6)}$$

In addition, the design value $f_{design}$ of the primary resonant mode was determined by performing a simulation of the finite element method or the like. Here, the relationship of the amount of shift in the resonant frequency, $|\Delta f_r|$, to the proportion of the film thickness of the TEOS-SiO$_2$ film 14 (proportion of the film thickness of the second silicon oxide film), $R_2$, is illustrated in FIG. 6.

Figure 6:
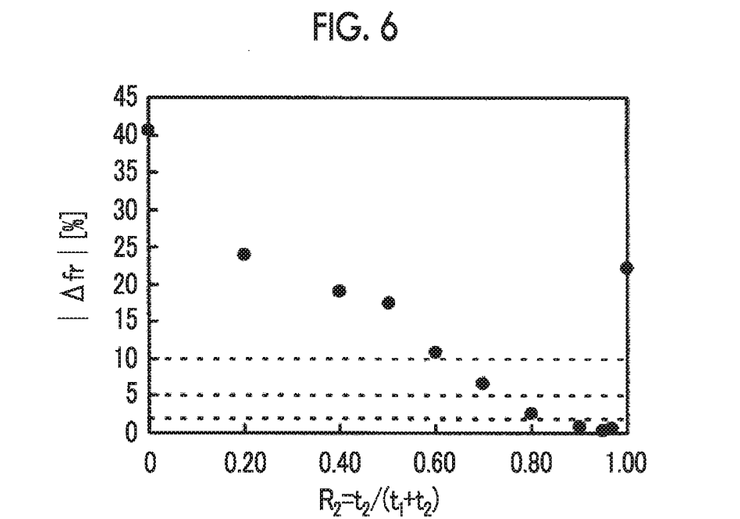
FIG. 6 is a diagram illustrating the relationship of the amount of shift in the resonant frequency, $|\Delta f_r|$, to the proportion $R_2$ of the film thickness of a TEOS-SiO$_2$ film (proportion of the film thickness of the second silicon oxide film).

From FIG. 6, it was found that a value of $|\Delta f_r|<10\%$ was obtained under the condition: $0.70 \leq R_2 < 1.00$; a value of $|\Delta f_r|<5\%$ was obtained under the condition: $0.80 \leq R_2 < 1.00$; and a value of $|\Delta f_r|<2\%$ was obtained under the condition: $0.90 \leq R_2 < 1.00$. From these results, it can be seen that the conditions under which the influence of the stress of the thermally oxidized film on the resonant frequency can be suppressed and a shift in the resonant frequency can be suppressed, are such that $0.70 \leq R_2 < 1.00$; the conditions under which further suppression can be achieved are such that $0.80 \leq R_2 < 1.00$; and the most preferred conditions are such that $0.90 \leq R_2 < 1.00$.

Furthermore, it was found that when $R_2 = 1.00$ (case in which the diaphragm is formed from the TEOS-SiO$_2$ film 14 only), the residual stress of the diaphragm is changed due to the damage caused by the ion implantation in the Bosch process, and the resonant frequency is shifted to a large extent. Therefore, it is preferable that $R_2 \leq 0.97$.

(Implementation Results 2)

Figure 7:
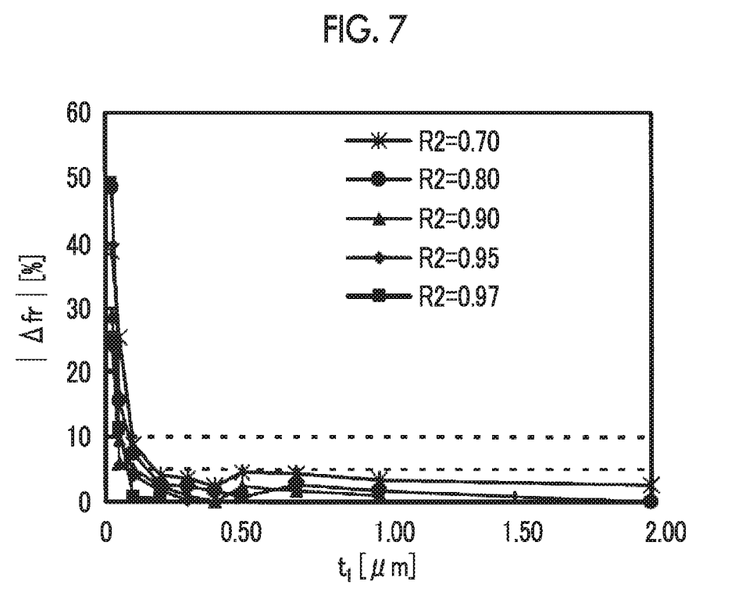
FIG. 7 is a diagram illustrating the relationship of $|\Delta f_r|$ to $t_1$ in the case in which 0.02 [μm]≤$t_1$≤2.00 [μm] is established.

Next, the relationship of $|\Delta f_r|$ to $t_1$ in a case in which $0.02$ [μm] $\leq t_1 \leq 2.00$ [μm] is satisfied under the conditions: $0.70 \leq R_2 \leq 0.97$, is illustrated in FIG. 7. Here, $t_2$ is defined such that $t_2 \leq 10.00$ [μm] so that the uniformity of the film thickness of the TEOS-SiO$_2$ film 14 can be maintained. From FIG. 7, it was found that under all conditions for $R_2$, a value of $|\Delta f_r|<10\%$ is obtained when $0.10$ [μm] $\leq t_1 \leq 2.00$ [μm]; and a value of $|\Delta f_r|<5\%$ is obtained when $0.20$ [μm] $\leq t_1 \leq 2.00$ [μm].

As such, it was found that when a thermally oxidized SiO$_2$ film 12 is used, the change in the residual stress resulting from any damage caused by the Bosch process can be suppressed, and the value of $|\Delta f_r|$ can be decreased.

[Stress Change in SiO$_2$ Film Resulting from Damage Caused by Bosch Process]

Figure 8:
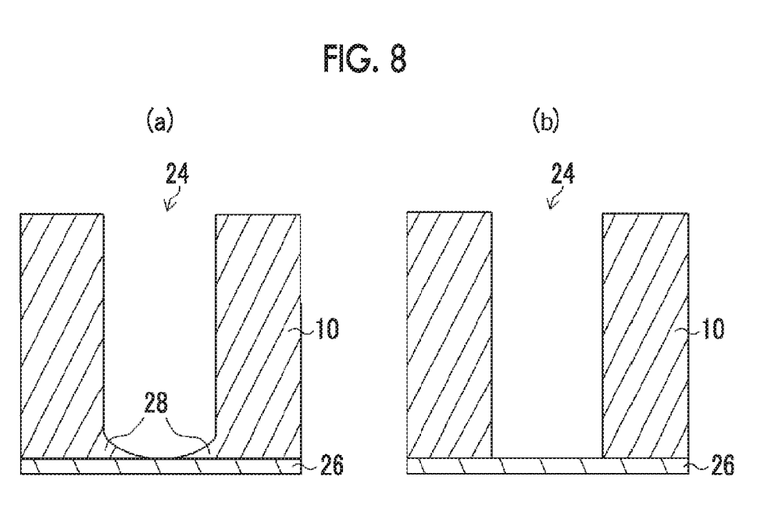
FIG. 8 is a diagram illustrating the production process of the Bosch process at the time of forming a diaphragm structure.

An instance will be considered, in which a diaphragm structure is formed by a Bosch process on a silicon substrate 10 having a SiO$_2$ film 26 formed thereon. The shape of openings 24 formed by a Bosch process does not become a satisfactory concave shape and has residual parts 28 as illustrated in (b) of FIG. 8 when the openings 24 reach the SiO$_2$ film 26. In order to sufficiently remove these residual parts 28, about 20% to 40% of over-etching is performed, and the final shape illustrated in (b) of FIG. 8 is formed. The etching of Si by the Bosch process is carried out such that Si is bombarded with SF$_X^+$ ions (X=1 to 6), and the ions react with Si with the energy of collision and remove Si. Therefore, when over-etching is performed in the state illustrated in (a) of FIG. 7, SFx$^+$ ions are implanted in the SiO$_2$ film, and form Si—F bonds or break Si—O—Si bonds.

The inventors of the present invention conducted a thorough investigation, and as a result, they found that the stress of a SiO$_2$ film changes due to F (fluorine) of the SF$_X^+$ ions implanted in the SiO$_2$ film as a result of over-etching. Thus, the inventors speculated that this causes a shift in the resonant frequency of a diaphragm-type resonant MEMS device from a design value. This speculation is also consistent with the point of a research paper which describes that the stress of SiOF is Changed by the F concentration in SiOF (for example, J. Electrochem. Soc., 144 (1997), 1100).

Here, SiO$_2$ formed by thermal oxidation is known as a stable material, and is most compact among those SiO$_2$ materials that can be formed by various methods. However, since SiO$_2$ formed by thermal oxidation has a coefficient of thermal expansion that is different from that of Si (Si: $2.4 \times 10^{-6}$ K$^{-1}$, and SiO$_2$: $0.5 \times 10^{-6}$ K$^{-1}$), when the temperature is returned from a temperature of formation of higher than 1000° C. to room temperature, large thermal stress occurs and adversely affects the resonant frequency. Also, warpage occurs due to residual stress, and the stability of the diaphragm structure is markedly decreased. As such, although a $SiO_2$ film has high residual stress, since a $SiO_2$ film is a dense film, the influence on the stress caused by the implantation of $SF_x^+$ ions is small.

On the other hand, $SiO_2$ deposited by a TEOS-CVD method or the like has low stress because the material is formed at a low temperature, and thus the material has less influence on the resonant frequency. However, it may be considered that the Si—O bond distance is large compared to that of a thermally oxidized $SiO_2$ film, or that since Si—H bonds and the like exist, when F ions enter the film, Si—F bonds can be easily formed, and stress is likely to be changed.

Therefore, in the diaphragm-type resonant MEMS device according to the present exemplary embodiment, a thermally oxidized $SiO_2$ film 12 that has less influence on the stress caused by the implantation of $SF_x^+$ ions is formed on the surface of a silicon substrate 10, and a TEOS-$SiO_2$ film 14 is formed on the thermally oxidized $SiO_2$ film 12. When such a configuration is adopted, the shift in resonant frequency caused by residual stress is suppressed by the TEOS-$SiO_2$ film 14, and the shift in resonant frequency caused by ion implantation is suppressed by the thermally oxidized $SiO_2$ film 12.

[Upper Limit of Film Thickness of Thermally Oxidized $SiO_2$ Film]

The growth rate of a thermally oxidized $SiO_2$ film becomes the diffusion limitation for oxygen in a thick film region, and is logarithmically saturated. In order to form a thermally oxidized $SiO_2$ film having a film thickness of 2.00 [μm], the growth takes about 24 hours; however, when the film thickness is 1.00 [μm], the oxidation time is reduced to half or less, and the production cost is decreased. Therefore, it is preferable that $t_1 \leq 1.00$ [μm].

[Features of Production Method of Present Exemplary Embodiment]

Figure 9:
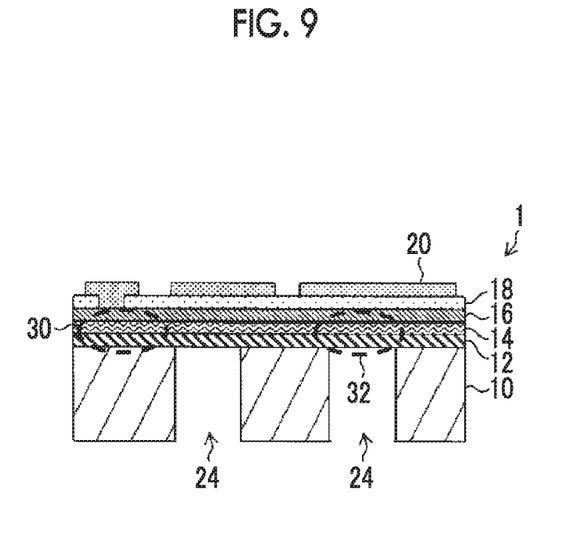
FIG. 9 is a diagram for explaining the damage caused by the Bosch process in a thermally oxidized SiO$_2$ film and a TEOS-SiO$_2$ film.

As illustrated in FIG. 9, when the back surface of the silicon substrate 10 of a laminate including a diaphragm composed of a thermally oxidized $SiO_2$ film 12 and a TEOS-$SiO_2$ film 14 is subjected to DRIE by a Bosch process, the thermally oxidized $SiO_2$ film 12 and the TEOS-$SiO_2$ film 14 of the region 30 where the silicon substrate 10 is maintained are not damaged by the Bosch process; however, the thermally oxidized $SiO_2$ film 12 and the TEOS-$SiO_2$ film 14 of the region 32 of the opening 24 where the silicon substrate 10 has been etching processed are damaged.

Therefore, when an elemental analysis is carried out by SIMS (Secondary Ion Mass Spectrometry) or the like, if the distribution of C or H in the thermally oxidized $SiO_2$ film 12 and the same distribution in the TEOS-$SiO_2$ film 14 are clearly divided in the region 30, it is implied that the production method of the present exemplary embodiment has been used.

Furthermore, the FTIR absorption spectrum obtained at the region 30 is observed such that the stretch mode peak of the thermally oxidized $SiO_2$ film 12 overlaps with the stretch mode peak of the TEOS-$SiO_2$ film 14, which has been shifted compared to that of the thermally oxidized $SiO_2$ film 12.

Furthermore, in a case in which the existence of a stepped shape called scallop can be confirmed on the side surfaces of the opening 24 in a SEM (Scanning Electron Microscope) image or the like of the region 32, it can be seen that DRIE has been performed by a Bosch process. Furthermore, when a peak of F or a bond related to F is detected in the thermally oxidized $SiO_2$ film 12 by a composition analysis such as SIMS or XPS, it can be seen that a Bosch process has been used.

[Other Uses of Diaphragm-Type Resonant MEMS Device of Present Exemplary Embodiment]

Regarding the diaphragm-type resonant MEMS device related to the present exemplary embodiment, applications thereof in acceleration sensors, ultrasonic sensors, fluid sensors, thin film resonance filters (Film Bulk Acoustic Resonator: FBAR, and Stacked thin film Bulk wave Acoustic Resonators and filters: SBAR) and the like may be considered, similarly to the conventional resonant MEMS devices that are produced using a BOX (Buried Oxide) layer of a SOI substrate as an etch stopper.

The technical scope of the invention is not intended to be limited to the scope described in the exemplary embodiment described above. In regard to the configuration and the like in various exemplary embodiments, appropriate combinations can be made between various exemplary embodiments to the extent that the gist of the invention is maintained.

EXPLANATION OF REFERENCES

1: diaphragm-type resonant MEMS device
2: substrate for diaphragm-type resonant MEMS devices
10: silicon substrate
12: thermally oxidized $SiO_2$ film
14: TEOS-$SiO_2$ film
16: lower electrode
18: piezoelectric film
20: upper electrode
22: pad
24: opening
26: $SiO_2$ film
28: residual part

What is claimed is:

1. A method for producing a diaphragm-type resonant micro electro mechanical system device, the method comprising the steps of:
forming a first silicon oxide film by thermal oxidation or by a process including a heat treatment at 900° C. or above;
forming a second silicon oxide film having a stress with an absolute value of 100 MPa or less;
forming a lower electrode;
forming a piezoelectric film;
forming an upper electrode;
laminating, on a first surface of a silicon substrate, the first silicon oxide film, the second silicon oxide film, the lower electrode, the piezoelectric film, and the upper electrode in this order; and
etching the opposite side surface of the first surface of the silicon substrate by deep reactive ion etching until the first silicon oxide film is exposed so as to form a recess, and thereby forming a diaphragm structure including a diaphragm having the first silicon oxide film and the second silicon oxide film,
wherein when the film thickness of the first silicon oxide film is designated as $t_1$, the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the following conditions are satisfied:

$$0.10 \ \mu m \leq t_1 \leq 2.00 \ \mu m; \text{ and}$$

$$R_2 \geq 0.70.$$

2. The method for producing a diaphragm-type resonant micro electro mechanical system device according to claim 1, wherein the film thickness $t_1$ of the first silicon oxide film satisfies the condition: $t_1 \leq 1.00 \ \mu m$.

3. The method for producing a diaphragm-type resonant micro electro mechanical system device according to claim 1, wherein the film thickness $t_1$ of the first silicon oxide film satisfies the condition: $t_1 \geq 0.20 \ \mu m$.

4. The method for producing a diaphragm-type resonant micro electro mechanical system device according to claim 1, wherein the proportion $R_2$ of the film thickness of the second silicon oxide film with respect to the sum of the film thickness of the first silicon oxide film and the film thickness of the second silicon oxide film satisfies the condition: $R_2 \geq 0.80$.

5. The method for producing a diaphragm-type resonant micro electro mechanical system device according to claim 1, wherein the proportion $R_2$ of the film thickness of the second silicon oxide film with respect to the sum of the film thickness of the first silicon oxide film and the film thickness of the second silicon oxide film satisfies the condition: $R_2 \geq 0.90$.

6. The method for producing a diaphragm-type resonant micro electro mechanical system device according to claim 1, wherein the proportion $R_2$ of the film thickness of the second silicon oxide film with respect to the sum of the film thickness of the first silicon oxide film and the film thickness of the second silicon oxide film satisfies the condition: $R_2 \leq 0.97$.

7. The method for producing a diaphragm-type resonant micro electro mechanical system device according to claim 1, wherein the film thickness $t_2$ of the second silicon oxide film satisfies the condition: $t_2 \leq 10.00 \ \mu m$.

8. The method for producing a diaphragm-type resonant micro electro mechanical system device according to claim 1, wherein the second silicon oxide film is formed by a tetraethyl orthosilicate-chemical vapor deposition method.

9. The method for producing a diaphragm-type resonant micro electro mechanical system device according to claim 1, wherein 25% to 40% of over-etching is performed in the etching step.

10. The method for producing a diaphragm-type resonant micro electro mechanical system device according to claim 1, wherein the deep reactive ion etching is achieved by a Bosch process.

11. The method for producing a diaphragm-type resonant micro electro mechanical system device according to claim 1, further comprising, forming through-holes that penetrate through the piezoelectric film before forming the upper electrode.

12. A diaphragm-type resonant micro electro mechanical system device produced by the method according to claim 1 comprising:
 a laminate in which a first silicon oxide film, a second silicon oxide film, a lower electrode, a piezoelectric film, and an upper electrode are laminated in this order; and
 a silicon substrate that supports the laminate through the first silicon oxide film side of the laminate,
 wherein a diaphragm structure including a diaphragm having the first silicon oxide film and the second silicon oxide film is formed,
 a recess is formed in the silicon substrate,
 the second silicon oxide film having a stress with an absolute value of 100 MPa or less, and
 when the film thickness of the first silicon oxide film is designated as $t_1$, the film thickness of the second silicon oxide film is designated as $t_2$, and the proportion of the second silicon oxide film with respect to the sum of the film thickness of the first silicon oxide film and the film thickness of the second silicon oxide film, $t_2/(t_1+t_2)$, is designated as $R_2$, the following conditions are satisfied:

$$0.10 \ \mu m \leq t_1 \leq 2.00 \ \mu m; \text{ and}$$

$$R_2 \geq 0.70.$$

13. A method for producing a diaphragm-type resonant micro electro mechanical system device, the method comprising the steps of:
 forming an upper electrode on the piezoelectric film side of a substrate for diaphragm-type resonant micro electro mechanical system devices in which a first silicon oxide film formed by thermal oxidation or by a process including a heat treatment at 900° C. or above, a second silicon oxide film having a stress with an absolute value of 100 MPa or less, a lower electrode, and a piezoelectric film are laminated in this order on a first surface of a silicon substrate; and
 etching the opposite side surface of the first surface of the silicon substrate by deep reactive ion etching until the first silicon oxide film is exposed so as to form a recess, and thereby forming a diaphragm structure including a diaphragm having the first silicon oxide film and the second silicon oxide film,
 wherein when the film thickness of the first silicon oxide film is designated as $t_1$, the film thickness of the second silicon oxide film is designated as $t_2$, and the proportion of the film thickness of the second silicon oxide film with respect to the sum of the film thickness of the first silicon oxide film and the film thickness of the second silicon oxide film, $t_2/(t_1+t_2)$, is designated as $R_2$, the following conditions are satisfied:

$$0.10 \ \mu m \leq t_1 \leq 2.00 \ \mu m; \text{ and}$$

$$R_2 \geq 0.70.$$

14. The method for producing a diaphragm-type resonant micro electro mechanical system device according to claim 13, wherein the film thickness $t_1$ of the first silicon oxide film satisfies the condition: $t_1 \geq 0.20 \ \mu m$.

15. The method for producing a diaphragm-type resonant micro electro mechanical system device according to claim 13, wherein the proportion $R_2$ of the film thickness of the second silicon oxide film with respect to the sum of the film thickness of the first silicon oxide film and the film thickness of the second silicon oxide film satisfies the condition: $R_2 \geq 0.80$.

16. The method for producing a diaphragm-type resonant micro electro mechanical system device according to claim 13, wherein the proportion $R_2$ of the film thickness of the second silicon oxide film with respect to the sum of the film thickness of the first silicon oxide film and the film thickness of the second silicon oxide film satisfies the condition: $R_2 \leq 0.97$.

17. The method for producing a diaphragm-type resonant micro electro mechanical system device according to claim 13, wherein the second silicon oxide film is formed by a tetraethyl orthosilicate-chemical vapor deposition method.

18. The method for producing a diaphragm-type resonant micro electro mechanical system device according to claim 13, wherein 25% to 40% of over-etching is performed in the etching step.

19. The method for producing a diaphragm-type resonant micro electro mechanical system device according to claim 13, wherein the deep reactive ion etching is achieved by a Bosch process.

* * * * *